(12) United States Patent
Imaoka

(10) Patent No.: US 7,112,863 B2
(45) Date of Patent: Sep. 26, 2006

(54) OPTICAL DEVICE, OPTICAL MODULE, SEMICONDUCTOR APPARATUS AND ITS MANUFACTURING METHOD, AND ELECTRONIC APPARATUS

(75) Inventor: Norio Imaoka, Takamori-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/823,652

(22) Filed: Apr. 14, 2004

(65) Prior Publication Data

US 2004/0245649 A1   Dec. 9, 2004

(30) Foreign Application Priority Data

Apr. 16, 2003  (JP) .............................. 2003-111643

(51) Int. Cl.
*H01L 31/0232* (2006.01)
(52) U.S. Cl. ...................... 257/432; 257/777
(58) Field of Classification Search .............. 257/257, 257/258, 431, 432, 433, 444, 777, 686, 782, 257/783
See application file for complete search history.

(56) References Cited

U.S. PATENT DOCUMENTS

| | | | | |
|---|---|---|---|---|
| 4,394,712 A | * | 7/1983 | Anthony | 361/779 |
| 5,399,898 A | * | 3/1995 | Rostoker | 257/499 |
| 5,825,080 A | * | 10/1998 | Imaoka et al. | 257/659 |
| 6,087,719 A | * | 7/2000 | Tsunashima | 257/686 |
| 6,175,141 B1 | * | 1/2001 | Hofbauer et al. | 257/444 |
| 6,569,762 B1 | * | 5/2003 | Kong | 438/667 |
| 6,608,371 B1 | * | 8/2003 | Kurashima et al. | 257/686 |
| 6,858,872 B1 | * | 2/2005 | Kondo | 257/80 |
| 6,867,496 B1 | * | 3/2005 | Hashimoto | 257/771 |
| 2005/0051883 A1 | * | 3/2005 | Fukazawa | 257/686 |

FOREIGN PATENT DOCUMENTS

| | | |
|---|---|---|
| JP | A 05-299700 | 11/1939 |
| JP | A 57-145367 | 9/1982 |
| JP | A 05-110048 | 4/1993 |
| JP | A 10-229162 | 8/1998 |
| JP | A 2001-339057 | 12/2001 |
| JP | A 2002-94082 | 3/2002 |
| JP | A 2002-134725 | 5/2002 |
| JP | A 2003-110147 | 4/2003 |

\* cited by examiner

*Primary Examiner*—S. V. Clark
(74) *Attorney, Agent, or Firm*—Oliff & Berridge, PLC

(57) ABSTRACT

The invention provides an optical device that enables a mutual electrical connection between the stacked semiconductor substrates to be realized with ease and high reliability and to provide for miniaturization. The optical device has a first semiconductor substrate having an optical part and a first pad, a second semiconductor substrate having an integrated circuit and a second pad which is stacked under the first semiconductor substrate, a through-hole continuously extending through the first and the second semiconductor substrate, and a conductive part so formed as to include the inside of the through-hole.

17 Claims, 8 Drawing Sheets

OPTICAL DEVICE, OPTICAL MODULE, SEMICONDUCTOR APPARATUS AND ITS MANUFACTURING METHOD, AND ELECTRONIC APPARATUS

BACKGROUND OF THE INVENTION

1. Field of Invention

This invention relates to an optical device, an optical module, a semiconductor apparatus and its manufacturing method, and an electronic apparatus.

2. Description of Related Art

Miniaturization of semiconductor apparatus is in demand. For example, in optical modules of the imaging type, such as CCD and MOS, stack structure of an optical chip receiving optical signals and a semiconductor chip processing electric signals is known. See, for example, Japanese Published Patent No. Hei-10-229162. Many of such methods were accomplished by techniques of bonding a wire to achieve an electrical connection, but setting up a wire led to limiting the scope of miniaturization. Otherwise, it is possible to conceive a method of attaining high density and miniaturization by forming an integrated circuit on both surfaces of a semiconductor chip, while this necessitates a new manufacturing process and equipment, thus increasing cost and making it difficult to assure reliability.

SUMMARY OF THE INVENTION

It is an object of the invention to provide a method of achieving an electrical connection between stacked semiconductor substrates with ease and high reliability as well as attaining miniaturization.

An optical device according to the invention can include a first semiconductor substrate with an optical part and a first pad, a second semiconductor substrate with an integrated circuit and a second pad being stacked under the first semiconductor, a through-hole continuously extending through the first and the second semiconductor substrate, and a conductive part so formed as to include the inside of the through-hole. Accordingly, the first and the second semiconductor substrate are electrically connected through a conductive part in the through-hole which continuously extends through these semiconductor substrates. Hence, it is possible to keep the outer dimensions of the optical device within a range of the outer dimensions of a stacked structure of the first and the second semiconductor substrate, thus enabling miniaturization to be attained.

In this optical device, the optical part may be formed on a side of a surface of the first semiconductor substrate opposite to the second semiconductor substrate.

In this optical device, the integrated circuit may be on a side of a surface of the second semiconductor substrate opposite to the first semiconductor substrate.

In this optical device, the through-hole may be so formed as to extend through at least one of the first and the second pad. By so doing, it makes it easier for the conductive part to be electrically connected to at least one of the first and the second pad.

This optical device further comprises an insulating layer formed on the inside of the through-hole, and the conductive part may be formed on the insulating layer. By so doing, it is possible to prevent the electrical continuity between the conductive part and a semiconductor portion on the inside thereof.

In this optical device, the conductive part may have an electrical connection on the side of the surface of the second semiconductor substrate opposite to the first semiconductor substrate.

In this optical device, a pitch of the electrical connection may be larger than a pitch of the second pad. By so doing, for example, a plurality of electrical connections may be disposed in an area two-dimensionally expanding, thereby, for example, improving the degree of freedom of the position for setting an external terminal.

This optical device may further comprise the external terminal provided on the electrical connection.

This optical device further comprises a resin layer formed on the side of the surface of the second semiconductor substrate opposite to the first semiconductor substrate, and the electrical connection may be formed on the resin layer. By so doing, stress upon the electrical connection may be relaxed by the resin layer.

In this optical device, the resin layer may be formed in an area overlapping the optical part. By so doing, generation of noise thereof may be restrained.

This optical device may further comprise an intermediate layer interposed between the first and the second semiconductor substrate.

In this optical device, the intermediate layer may include a metallic layer formed in the area overlapping the optical part. Since the metallic layer reflects light, any unnecessary light incident to the optical device may be cut to restrain generation of noise thereof.

In this optical device, the optical part may have a plurality of light-receiving elements.

In this optical device, each of the plurality of light-receiving elements may be arrayed for image sensing.

An optical module according to this invention further comprises the above-mentioned optical device, a wiring substrate facing the second semiconductor substrate, and a substrate member holding a lens mounted on the wiring substrate and provided above the first semiconductor substrate.

A semiconductor apparatus according to the invention can include a first semiconductor substrate with a first integrated circuit and a first pad, a second semiconductor substrate with a second integrated circuit and a second pad being stacked under the first semiconductor substrate, a through-hole continuously extending through the first and the second semiconductor substrate, and a conductive part so formed as to include the inside of the through-hole. The first integrated circuit can be formed on the side of the surface of the first semiconductor substrate opposite to the second semiconductor substrate, and the second integrated circuit can be formed on the side of the surface of the second semiconductor substrate opposite to the first semiconductor substrate. Accordingly, the first and the second semiconductor substrate are electrically connected through a conductive part in the through-hole which continuously extends through these semiconductor substrates. Hence, it can be possible to keep the outer dimensions of the semiconductor apparatus within a range of the outer dimensions of a stacked structure of the first and the second semiconductor substrate, thus enabling miniaturization to be attained. Also, since an integrated circuit is formed on both surfaces of the semiconductor apparatus, in pseudo terms, the same effect as having an integrated circuit on both surfaces of one semiconductor substrate can be achieved. Further, by selecting a combination of the first and the second semiconductor substrate, it is possible to realize easily a semiconductor apparatus having a variety of functions, thus providing a very high degree of design freedom.

In this semiconductor apparatus, the through-hole may be so formed as to extend through at least one of the first and the second pad. By so doing, it becomes easier for the conductive part to connect electrically to at least one of the first and the second pad.

This semiconductor apparatus can further include an insulating layer formed on the inside of the through-hole, and the conductive part may be formed on the insulating layer. By so doing, it is possible to prevent the electrical continuity between the conductive part and a semiconductor portion of the inside of the through-hole.

In this semiconductor apparatus, the conductive part may have an electrical connection on the side of the surface of the second semiconductor substrate opposite to the first semiconductor substrate.

In this semiconductor apparatus, a pitch of the electrical connection may be larger than a pitch of the second pad. By so doing, for example, a plurality of electrical connections may be disposed in an area two-dimensionally expanding, and, for example, the degree of freedom of the setting position of the external terminal improves.

This semiconductor apparatus may further comprise the external terminal provided on the electrical connection.

This semiconductor apparatus may further comprise a resin layer formed on the side of the surface of the second semiconductor substrate opposite to the first semiconductor substrate, and the electrical connection may be formed on the resin layer. By this means, stress upon the electrical connection may be relaxed by the resin layer.

An electronic apparatus according to this invention comprises the above-mentioned optical device, optical module or semiconductor apparatus.

A manufacturing method of a semiconductor apparatus according to this invention can include the steps of stacking a first semiconductor substrate with a first integrated circuit and a first pad on a second semiconductor substrate with a second integrated, circuit and a second pad, forming a through-hole continuously extending through the first and the second semiconductor substrate after the first stacking process, and forming a conductive part so as to include the inside of the through-hole. According to this invention, after stacking the first and the second semiconductor substrate, the through-hole continuously extending through these semiconductor substrates is formed, and the conductive part is so formed as to include the inside of the through-hole. Since a semiconductor apparatus having an integrated circuit on both surfaces is manufactured by stacking the first and the second semiconductor substrate, cost may be kept under control and reliability may be improved more than the method of forming an integrated circuit on both surfaces of a semiconductor substrate. Also, the through-hole 32 and the conductive part 38 may be formed in one package together with the first and the second semiconductor substrate, so that the manufacturing process may be simplified.

In the manufacturing method of this semiconductor apparatus, the first integrated circuit can be formed on one side of the surface of the first semiconductor substrate, the second integrated circuit is formed on one side of the surface of the second semiconductor substrate, and the first and the second semiconductor substrate may be stacked such that the other sides of the surfaces may face each other in the (b) process.

In the manufacturing method of this semiconductor apparatus, the through-hole may be so formed as to extend through at least one of the first and second pads. By so doing, it makes it easier for the conductive part to be electrically connected to at least one of the first and the second pad.

The manufacturing method of this semiconductor apparatus further comprises a step of forming an insulating layer on the inside of the through-hole prior to the forming a conductive part process, and the conductive part may be formed on the insulating layer in the forming a conductive part process. By so doing, it is possible to prevent any electrical continuity between the conductive part and a semiconductor portion on the inside of the through-hole.

In the manufacturing method of this semiconductor apparatus, the conductive part may be so formed in the forming a conductive part process as to have an electrical connection on the side of the surface of the second semiconductor substrate opposite to the first semiconductor substrate.

In the manufacturing method of this semiconductor apparatus. the conductive part may be formed such that, in the forming a conductive part process, a pitch of the electrical connection becomes bigger than a pitch of the second pad. By so doing, for example, a plurality of electrical connections may be disposed in the area expanding two-dimensionally and, for example, the degree of freedom of the setting position of the external terminal improves.

The manufacturing method of this semiconductor apparatus may further comprise a resin layer on the side of the surface of the second semiconductor substrate opposite to the first semiconductor substrate.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Figure 1:
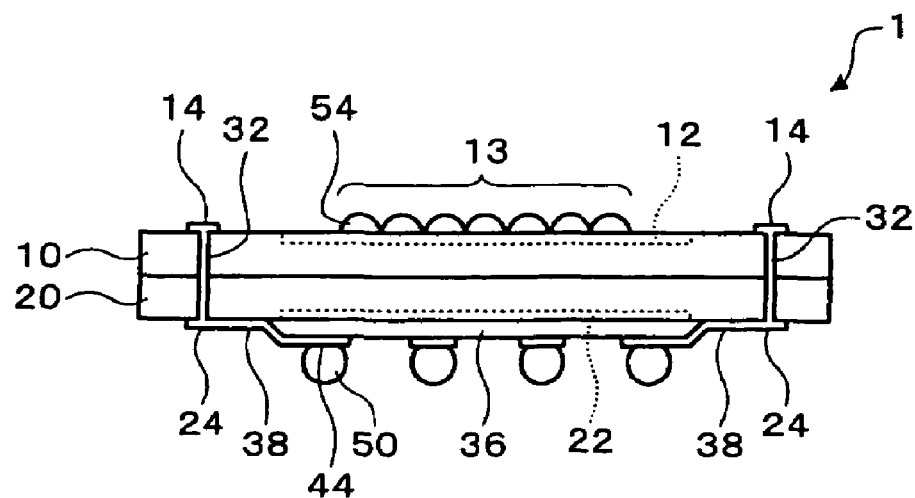
FIG. 1 is a sectional view of an optical device according to a first embodiment of this invention.
Figure 2:
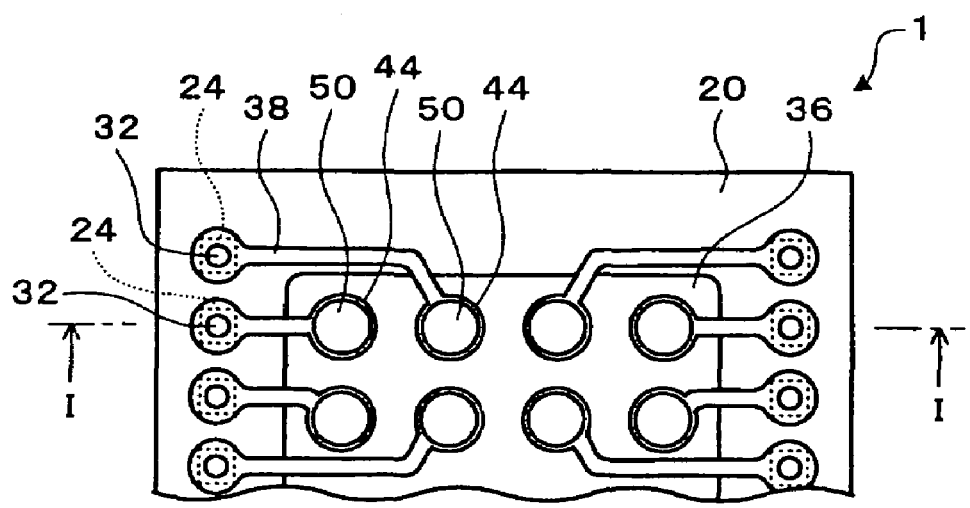
FIG. 2 is a plan view of an optical device according to a first embodiment of this invention.
Figure 3:
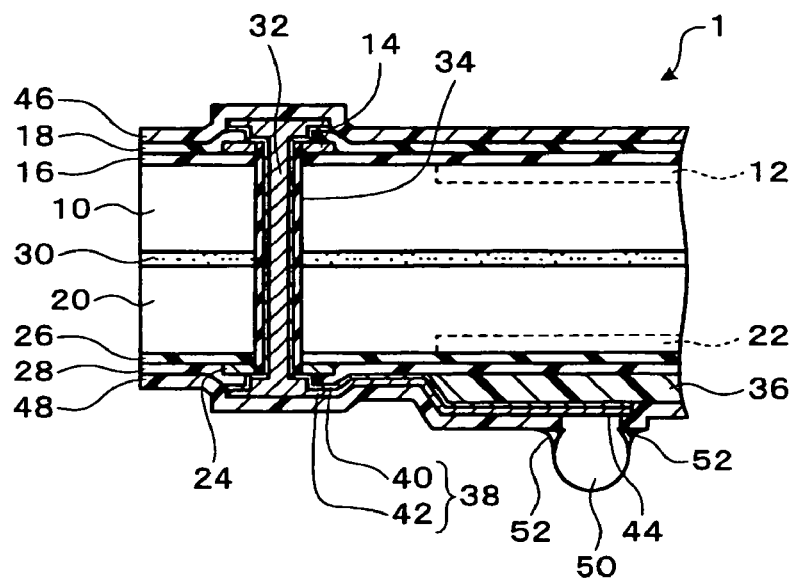
FIG. 3 is an expanded sectional view of an optical device according to a first embodiment of this invention.

Preferred embodiments of this invention will be described below with reference to the drawings. FIGS. 1, 2, 3 and 4 are drawings showing an optical device according to the first embodiment of this invention. FIG. 1 is a section of the optical device and a sectional view of FIG. 2 along line I—I. FIG. 2 is a plan view of the optical device. In FIG. 1 and FIG. 2, a portion of the optical device (photoresist layers 46, 48 and the like) is omitted. FIG. 3 is an expanded sectional view of the optical device. It is to be noted that although in this embodiment, the optical device will be described as an example of a semiconductor apparatus, a semiconductor apparatus according to this invention is not limited to the optical device.

The optical device has a first and a second semiconductor substrate 10. The first semiconductor substrate 10 may be a semiconductor chip (for example, a silicon chip) or a semiconductor wafer (for example, a silicon wafer). The first semiconductor substrate 10 has a first integrated circuit 12. If the first semiconductor substrate 10 forms a rectangular parallelepiped, the first integrated circuit 12 is formed on either one of the surfaces (widest face) of the first semiconductor substrate. There is formed one independent first integrated circuit 12 on a semiconductor chip, and there are formed a plurality of independent integrated circuits 12 on a semiconductor wafer. The first semiconductor substrate 10 has a plurality of (a plurality of groups in a case of semiconductor wafers) first pads 14. At least one of the plurality of first pads 14 is electrically connected to the first semiconductor circuit. The first pads 14 may be exposed to a surface on which the first semiconductor circuit 12 on the first semiconductor substrate 10 is formed. The plurality of first pads 14 may be arrayed at an end (along at least one side (for example, two opposite sides or four opposite sides)) of the semiconductor substrate 10 (for example, a semiconductor chip). The plurality of first pads 14 may be arrayed in a manner of surrounding the first integrated circuit 12. The plurality of first pads 14 may be formed of an aluminum type or a steel type of metal. As FIG. 3 shows, passivation films 16 and 18 are formed in one or a plurality of layers on the first semiconductor substrate 10. The passivation films 16 and 18 may be formed of, for example, $SiO_2$, SiN, a polyimide resin and the like.

A second semiconductor substrate 20 has a second integrated circuit 22 and a second pad 24. There are formed passivation films 26 and 28 on the second semiconductor substrate 20. As FIG. 1 and FIG. 2 show, the shape of the second semiconductor substrate 20 (for example, a plane figure) may be identical to the shape of the first semiconductor 10. Other contents of the second semiconductor substrate 20 may be the same as the above-mentioned first semiconductor substrate 10.

In this embodiment, the first semiconductor substrate 10 has an optical part 13. The optical part 13 is a part to which light enters or from which light is emitted. The optical part 13 converts optical energy and other energies (for example, electrical energy). Namely, the optical part 13 has at least one energy converter (not illustrated). The energy converter (a light-receiving element and a light-emitting device) is a part of the first integrated circuit 12. In this embodiment, the energy converter is the light-receiving element (for example, a photodiode). A plurality of light-receiving elements may be so disposed as to enable image sensing by corresponding to each of a plurality of pixels two-dimensionally arrayed. That is, the optical device may be an image sensor (for example, a CCD image sensor or a CMOS image sensor).

The optical part 13 may be equipped with a plurality of micro-lenses 54. The micro-lenses 54 are provided corresponding to each of the plurality of the light-receiving elements, being capable of stopping down light incident to each light-receiving element. The micro-lenses 54 may be convex lenses. Although surfaces of the micro-lenses 54 may be of smooth curvature, so long as the surfaces can refract light, no restriction is imposed on the surface shape. The micro-lenses 54 are placed on the side of the surface on which the first integrated circuit 12 on the first semiconductor substrate 10 is formed.

The optical part 13 may have a color filter (not illustrated). The color filter is provided corresponding to each of the plurality of the light-receiving elements. The color filter may be formed between the micro-lenses 54 and the light-receiving elements. For example, there may be provided a flattened layer (not illustrated) on the color filter with the micro-lenses 54 thereon.

The first and second semiconductor substrates 10 and 20 are mutually stacked. In an example shown in FIG. 1, the first and the second semiconductor substrate 10 and 20 are stacked such that the surfaces of these semiconductor substrates opposite to the formed surfaces of the first and the second integrated circuit 12 and 22 face each other. In other words, the optical part 13 (or the first integrated circuit 12) is formed on the side of the surface of the first semiconductor substrate 10 opposite to the second integrated substrate 20, and the second integrated circuit 22 is formed on the side of the surface of the second integrated substrate 20 opposite to the first integrated substrate 10. In an example shown in FIG. 1, semiconductor chips are stacked and semiconductor wafers may be stacked.

As FIG. 3 shows, there may be interposed an intermediate layer 30 between the first and the second semiconductor substrate 10 and 20. The intermediate layer 30 may be an adhesive layer. Namely, the first and the second semiconductor substrate 10 and 20 may be bonded to each other. The intermediate layer 30 may have an insulating property.

A through-hole 32 is formed in the first and the second semiconductor substrate 10 and 20. In particular, the through-hole 32 extends continuously (integrally) through the first and the second semiconductor substrate 10 and 20. The inner wall surface of the through-hole may be perpendicular or slanted to the surface of either semiconductor substrate. A width (diameter) of the through-hole 32 may be constant or partially different. The sectional shape of the through-hole 32 may be circular as shown in FIG. 2 or angular. The through-hole 32 may so formed as to extend through at least one of the first and the second pad 14 and 24. For example, in a case of the first and the second pad 14 and 24 overlapping, the through-hole 32 may be formed in a position of extending through both the first and the second pad 14 and 24. Or if the first and the second pad 14 and 24 do not overlap, the through-hole 32 may be formed in a position of extending through either the first or the second pad 14 and 24. The through-hole 32 can have a sectional area less than the pad area and, for example, may extend through the center of the pad. It is to be noted that a plurality of through-holes 32 may be formed in a manner of surrounding the optical part 13 (or the first integrated circuit 12) and the second integrated circuit 22.

One or a plurality of resin layers 36 (one layer in FIG. 3) are formed on the second semiconductor substrate 20. In particular, the resin layer 36 is formed on the side of the surface of the second semiconductor substrate 20 opposite to the first semiconductor substrate 10. The resin layer 36 is formed on the passivation films 26 and 28 by keeping away from the second pad 24. For example, the resin layer 36 may be formed within an area surrounded by a plurality of second pads 24. As shown in FIG. 1, the resin layer 36 may be formed in an area where the optical part 13 of the first semiconductor substrate 10 overlaps. By so doing, if the resin layer 36 has a light shielding property (property of shutting off at least part of light of a wavelength to which the light-receiving element reacts), it is possible to keep the generation of noise of the optical device under control, hence, it is desirable. The resin layer 36 may have a slanted side so as to make an end surface of the semiconductor substrate larger than a tip surface. The resin layer 36 may have a stress relaxing function. The resin layer 36 may be formed of a polyimide resin, a silicone denatured polyimide resin, an epoxy resin, a silicone denatured epoxy resin, benzocyclobutene (BCB), polybenzoxazole (PBO) and the like. The resin layer 36 may also be formed between the second semiconductor substrate 20 and an external terminal 50 to be explained later.

A conductive part 38 is formed inside the through-hole 32. In particular, part of the conductive part is disposed inside the through-hole 32. The conductive part 38 may bury the through-hole 32. Or the conductive part 38 is formed inside the through-hole 32 and a through-aperture of a small diameter may be formed in a central portion of the through-hole 32. The conductive part 38 is electrically connected to at least one (both in FIG. 3) of the first and the second pad 14 and 24. In an example illustrated in FIG. 3, an insulating layer 34 is formed on the inside of the through-hole 32, and the conductive part 38 is formed on the insulating layer 34. By so doing, it is possible to prevent the electrical continuity between the conductive part 38 and a semiconductor portion (for example, a silicon portion) on the inside of the through-hole 32. The conductive part 38 may be formed in one or a plurality of layers. In an example shown in FIG. 3, the first and the second conductive layer 40 and 42 are included.

The conductive part 38 has an electrical connection 44 with other electronic parts (for example, a wiring substrate 60 (refer to FIG. 4)). The electrical connection 44 may be formed on the second semiconductor substrate 20. In particular, the electrical connection 44 is formed on the side of the surface of the second semiconductor substrate 20 opposite to the first semiconductor substrate 10. The electrical connection 44 may be formed on the through-hole 32 and may overlap the second pad 24. The electrical connection 44 may be formed of a different material than other portions of the conductive part 38. For example, a plated layer (for example, gold plating) may be formed only on the surface of the electrical connection 44. The electrical connection 44 may be provided with the external terminal 50. The external terminal 50 may be of solder (for example, solder ball).

A plurality of electrical connections 44 may be formed by keeping away from the through-hole 32. Namely, the conductive part 38 is formed as wiring on the surface of the second semiconductor substrate 20 and part of the wiring may be the electrical connection 44. A tip of the wiring may be the electrical connection 44. The electrical connection 44 may be formed on the resin layer 36. Namely, the conductive part 38 may extend to reach over the resin layer 36. By so doing, stress upon the electrical connection 44 (or the external terminal 50) may be relaxed by the resin layer 36.

As shown in FIG. 2, a pitch of the electrical connections 44 with one another in the vicinity may be larger than a pitch of the second pads 24 with one another in the vicinity. Namely, pitch conversion may be performed. By so doing, for example, the plurality of electrical connections 44 may be disposed in an area expanding two-dimensionally and the degree of freedom of the setting position of the external terminal 50 improves.

As shown in FIG. 3, photoresist layers 46 and 48 may be formed on the first and the second semiconductor substrate. The photoresist layers 46 and 48 have the insulating property. The photoresist layer 46 covers the conductive part 38 which is exposed to over the first semiconductor substrate 10 and the photoresist layer 48 covers the conductive part 38 which is exposed to over the second semiconductor substrate 20. However, the photoresist layer 48 is formed by keeping away from part of the conductive layer 38 (electrical connections 44). By using the photoresist layers 46 and 48, it is possible to prevent the oxidation, corrosion, and electrical defect of the conductive part 38. As an example of variation, the sides of the first and the second semiconductor substrate 10 and 20 may be covered with the photoresist layer. Further, the photoresist layer may be integrally formed over the external surfaces of the first and the second semiconductor substrate 10 and 20.

A covering layer 52 may be formed on the photoresist layer 48. The covering layer 52 covers a base part (a lower end part) of the external terminal 50. As shown in FIG. 3, the covering layer 52 may be formed only on the surroundings of the external terminal 50. At least the base part of the external terminal 50 is reinforced with the covering layer 52. Namely, after the optical device is packed on a wiring substrate 60 (refer to FIG. 4), it is possible to disperse the concentration of stress to the external terminal 50 through the covering layer 52.

According to a semiconductor apparatus (an optical device) of this embodiment, the first and the second semiconductor substrate 10 and 20 are electrically connected through the conductive part 38 in the through-hole 32 which extends continuously through these semiconductor substrates. Hence, it becomes possible to put the outer dimensions of the semiconductor apparatus (optical device) within a range of the outer dimensions of the stacked structure of the first and the second semiconductor substrate 10 and 20, thus enabling miniaturization to be achieved. Further, since the integrated circuits are formed on both surfaces of the semiconductor apparatus (the optical device), it is possible to accomplish, in pseudo terms, the same effect of a semiconductor apparatus having integrated circuits on both surfaces of one semiconductor substrate. Moreover, by selecting a combination of the first and the second semiconductor substrate 10 and 20, it is possible to realize a semiconductor apparatus having a variety of functions, thereby producing a very high degree of design freedom.

Figure 4:
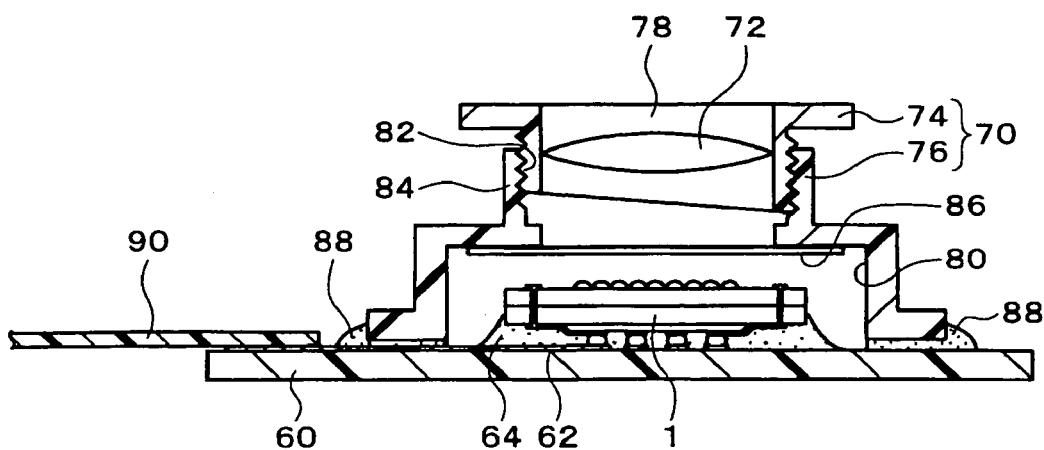
FIG. 4 is an exemplary diagram showing an optical module according to a first embodiment of this invention.

FIG. 4 is a sectional view of an optical module including an optical device. The optical module may be an image sensor module. The optical module includes an optical device 1, a wiring substrate 60, and a substrate member 70.

The wiring substrate 60 may be a rigid substrate or a flexible substrate. The wiring substrate 60 has a wiring pattern 62. The wiring pattern 62 may be formed by applying known technology, such as plating techniques and exposure techniques. The optical device 1 is mounted on the wiring substrate 60. In particular, the wiring substrate 60 is located opposite to the second semiconductor substrate 20, and the electrical connection 44 and the wiring pattern 62 are electrically connected. Solder (the external terminal 50 in FIG. 3) may be interposed between the two for joining. An underfill material (sealant) 64 may be set up between the optical device 1 and the wiring substrate 60. It is to be noted that no restriction is imposed on the electrical connection mode of the optical device 1 and the wiring substrate 60, so that an anisotropic conductive material such as an anisotropic conductive film (ACF) or an anisotropic conductive paste (ACP) may be employed or a connection mode through the contraction strength of an insulating resin may also be applied.

The substrate member 70 is an armor of the optical device 1 and may be called a frame. It is desirable that the substrate member 70 is formed of a light shielding material (for example, a resin or a metal). The substrate member 70 may be formed by injection molding. The substrate 70 is attached to the wiring substrate 60 in a manner of surrounding the optical device 1. The substrate member 70 may be bonded to the wiring substrate 60 with an adhesive 88. The substrate member 70 holds a lens 72. The substrate member and the lens 72 may be called an imaging optical system. The substrate member 70 may be formed of, as explained later, a plurality of members which are mutually separable or may be integrally constructed with one member.

The substrate member 70 includes a first and a second part 74 and 76. The lens 72 is attached to the first part 74. Namely, the first part 74 is a lens holder. In particular, the first part 74 has a first hole 78, and the lens 72 is held inside the first hole 78. The lens 72 may be fixed to inside the first hole 78 with a screw (not illustrated) formed inside the first part 74. The lens 72 is provided above the optical device 1 (for details, refer to the first semiconductor substrate 10).

As shown in FIG. 4, the second part 76 has a second hole 80, and the first part 74 is held inside the second hole 80. The first and the second holder 78 and 80 comprise a through-hole in communication with each other. The optical device 1 may be placed inside the second hole 80. On the outside of the first part 74 and on the inside of the second hold 80 of the second part 76, there are formed the first and the second screw 82 and 84 which link the first and the second part 74 and 76 together. And by means of the first and the second screw 82 and 84, the first part 74 is made position-adjustable along the axial direction of the second hole 80 in the second part 76. In this way, focus of the lens 72 may be adjusted.

The optical module includes an optical filter 86. The optical filter 86 may be a filter which transmits only light having a specific wavelength (for example, visible light) or a filter having a small loss with respect to light of a specific wavelength (for example, visible light). The optical filter 86 may be attached to the substrate member 70 (for example, the second hole 80). Or the lens 72 may be equipped with a function of the optical filter 86. In the optical filter 86, there is formed an optical function film such as an anti-reflection coat (AR coat) and an infrared shield coat (IR coat).

From the end part of the wiring substrate 60, a flexible substrate 90 may extend. For example, through the flexible substrate 90, the wiring substrate 60 may be electrically connected to other circuit substrates (for example, mother board). Or the wiring substrate 60 may be a mother board. On the wiring substrate 60, there may be mounted other electronic parts (not illustrated). As electronic parts, there are active parts (semiconductor chips with an integrated circuit built in and the like), passive parts (resistors, capacitors and the like), functional parts (filters and other parts that change an input signal property), connection parts (flexible substrates, connectors, switches and the like), converters (parts converting input signals such as sensors into an energy system with different input signals) and the like.

Since an optical module according to this embodiment has the above-mentioned optical device, it is possible to achieve miniaturization and high density.

Next, as shown in FIG. 5(A) to FIG. 8, a manufacturing method of a semiconductor apparatus according to this embodiment will be described. The contents of the manufacturing method of the semiconductor apparatus include the contents obtained from the above-mentioned semiconductor apparatus. It is to be noted that the contents of the above-mentioned semiconductor apparatus include the contents obtained from the manufacturing method of the semiconductor apparatus.

Figure 5A:
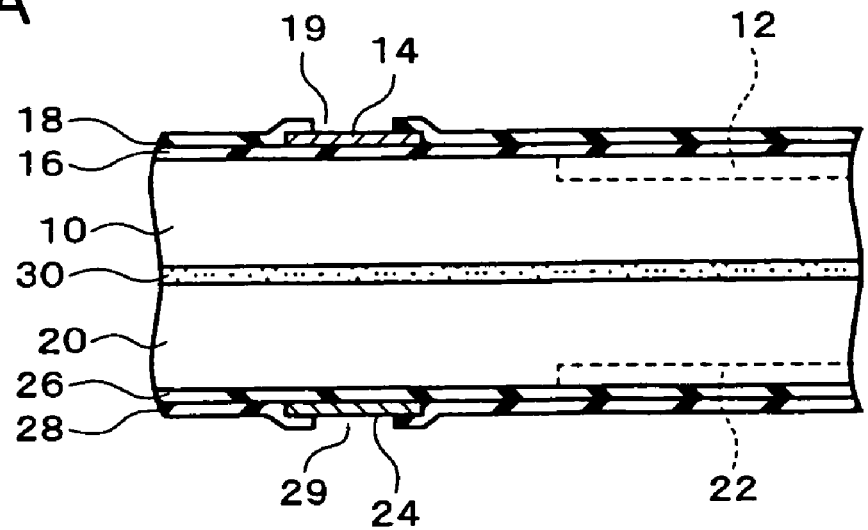
FIG. 5(A) to FIG. 5(C) are exemplary diagrams showing a manufacturing method of a semiconductor apparatus according to a first embodiment of this invention.

As shown in FIG. 5(A), the first and the second semiconductor substrate 10 and 20 are stacked. In particular, the first and the second semiconductor substrate 10 and 20 are stacked such that the surfaces of these substrates opposite to the formed surfaces of the first and the second integrated circuit 12 and 22 face each other. An intermediate layer 30 may be interposed between the first and the second semiconductor substrate 10 and 20. The intermediate layer 30 may be an adhesive layer, and the adhesive layer may be either in the form of paste or sheet.

As an example of variation, the first and the second semiconductor substrates may be joined by anode bonding. In anode bonding, joining is performed by generating static attraction on the interface while the first and the second semiconductor substrate 10 and 20 are in the state of being heated at high temperature. In a case of between semiconductor substrates having the same materials (for example, between silicon substrates), because both have the identical coefficient of thermal expansion, when the temperature returns to normal, warpage of the interface of a joint due to divergence of the coefficient of thermal expansion may be prevented. Further, in this case, the intermediate layer 30 may be omitted, thereby making it possible to provide further miniaturization of a semiconductor apparatus.

As shown in FIG. 5(A), the passivation film 16 is formed on a surface of the first semiconductor substrate 10 on which the first integrated circuit 12 is formed, and the first pad 14 is formed thereon. Further, the other passivation film 18 may be formed by keeping away from at least a part (for example, central part) of a surface of the first pad 14 After the passivation film is formed by covering the surface of the first pad 14, part thereof is subjected to etching and forming an opening 19, therefore, at least a part of the first pad 14 may be exposed from the opening 19. The same applies to the second semiconductor substrate 20, and at least part of the second pad 24 is exposed from an opening 29 of the passivation film 28.

Figure 5B:
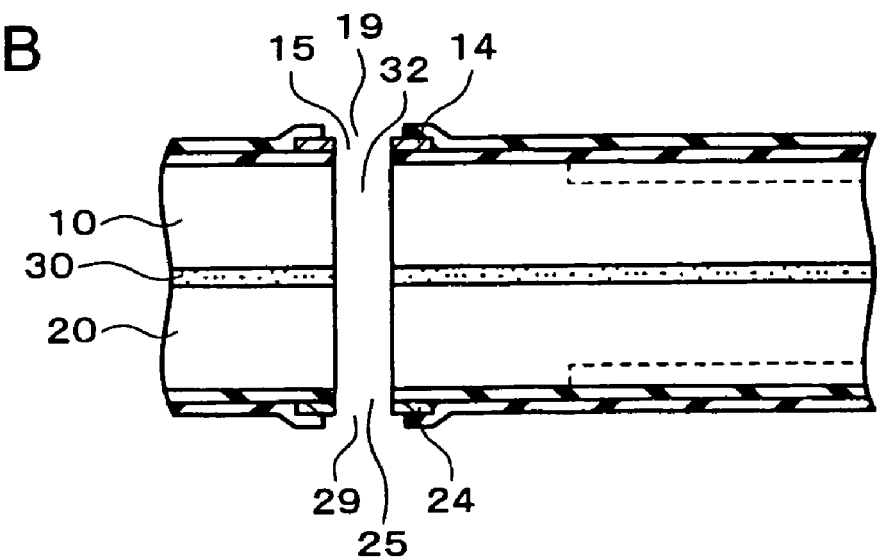

As shown in FIG. 5(B), a through-hole 32 is formed. In particular, the through-hole 32 is formed such that the through-hole 32 continuously extends through the first and the second semiconductor substrate 10 and 20 (integrally). The first and the second semiconductor substrate 10 and 20 may be simultanrously pierced through. If the intermediate layer 30 is to be interposed between the first and the second semiconductor substrate 10 and 20, the through-hole 32 also extends through the intermediate layer 30. For formation of the through-hole 32, for example, a laser (a YAG laser, a $CO_2$ laser, an exima laser and the like) may be used, and etching (dry etching or wet etching) may be applied. The through-hole 32 may be so formed as to extend through at least one of the first and the second pad 14 and 24. In an example shown in FIG. 5(B), the through-hole 32 extends through each of a hole 15 of the first pad 14 and a hole 25 of the second pad 24.

Figure 5C:
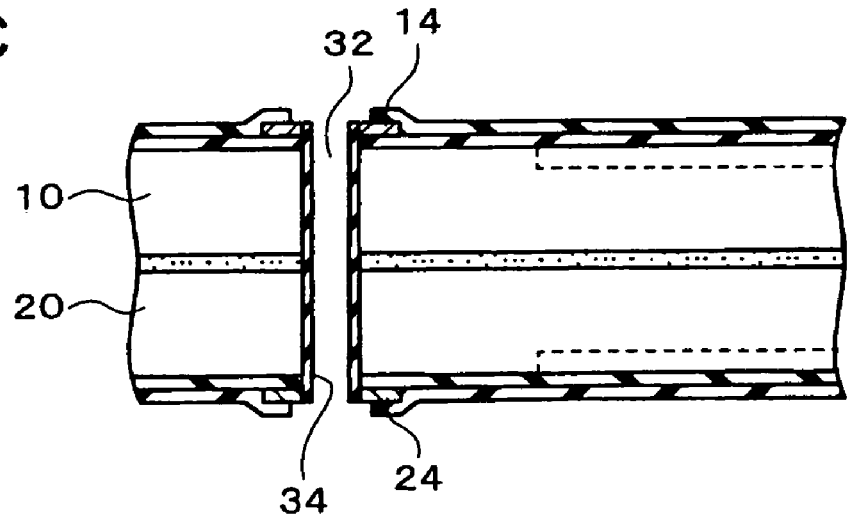

As shown in FIG. 5(C), an insulating layer 34 is formed on the inside of the through-hole 32. The insulating layer 34 is formed by supplying an insulating material to the through-hole 32. The insulating material is set up by a screen printing method, an ink jet printer method, chemical vapor deposition (CVD), a spray method or coating by a dispenser. The insulating layer is so formed as not to clog the through-hole 34. In an example shown in FIG. 5(C), the insulating layer 34 is formed such that at least part of each of the first and second pads 14 and 24 may be exposed.

Figure 6A:
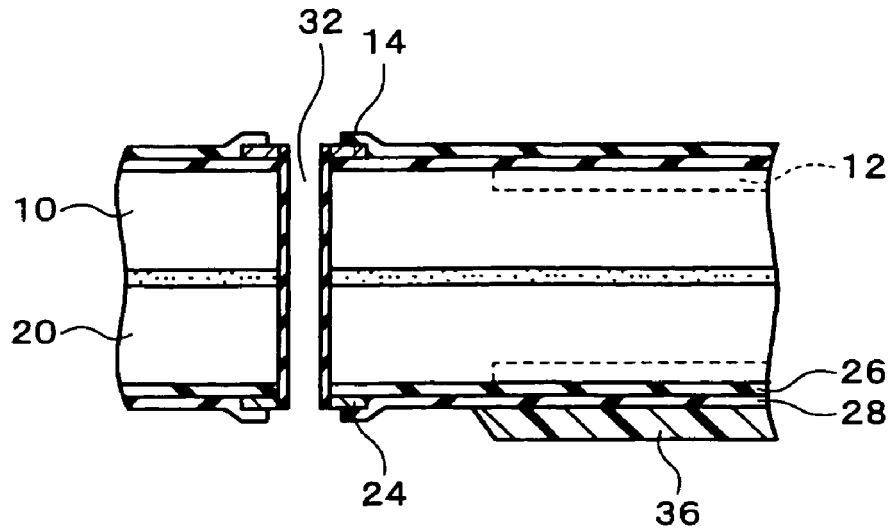
FIG. 6(A) to FIG. 6(C) are exemplary diagrams showing a manufacturing method of a semiconductor apparatus according to a first embodiment of this invention.

As shown in FIG. 6(A), a resin layer 36 is formed at the second semiconductor substrate 20 (to be specific, at the passivation films 26 and 28). The resin layer 36 may be subjected to patterning by applying photolithography techniques to a photosensitive resin or by etching a non-photosensitive resin. The resin layer 36 may be formed in an area overlapping the first integrated circuit 12.

As shown in FIG. 6(B) to FIG. 7(A), a conductive part 38 is formed so as to include the inside of the through-hole 32. The conductive part 38 is formed by supplying a conductive material. The conductive material is set up by the screen printing method, the ink jet printer method, chemical vapor deposition (CVD), the spray method or coating by a dispenser. According to this embodiment, the conductive part 38 includes the first and the second conductive layer 40 and 42.

Figure 6B:
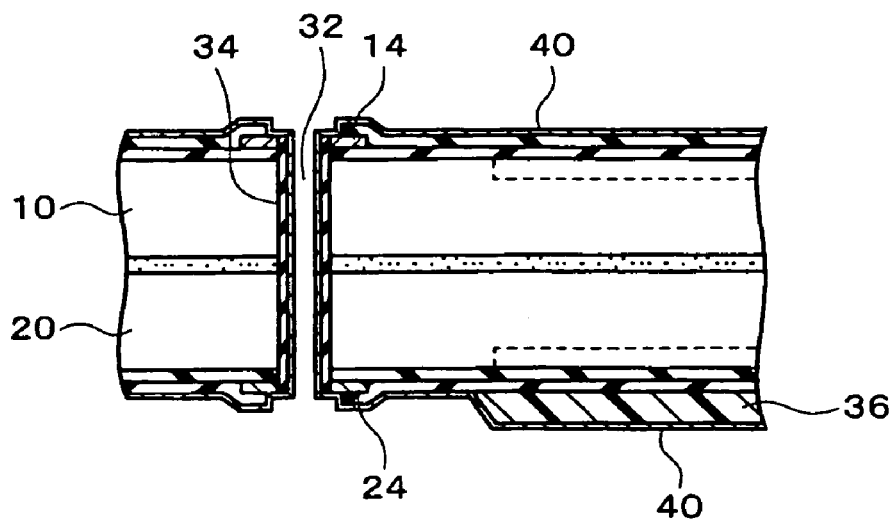

First, as shown in FIG. 6(B), a first conductive layer 40 is formed. The first conductive layer 40 may at least include a barrier layer. The barrier layer is for preventing a material set up thereon from dispersing to the first and the second semiconductor substrate. The barrier layer may be formed of a material different from the material thereon (for example, TiW or TiN). The first conductive layer 40 may include a seed layer. The seed layer is formed after the barrier layer is formed. The seed layer may be formed of the same material as a material set up thereon (for example, Cu). The first conductive layer 40 is so set up as not to bury the inside of the through-hole 32. Namely, inside the through-hole 32, a through-aperture surrounded by the first conductive layer 40 may be formed. The first conductive layer 40 may be formed on the surfaces of the first and the second semiconductor substrate 10 and 20 and over the entire interior of the through-hole 32. Or, the first conductive layer 40 may be formed only on the insulating layer 34 inside the through-hole 32. The first conductive layer 40 may be so formed as to connect electrically to at least one of the first and the second pad 14 and 24.

Figure 6C:
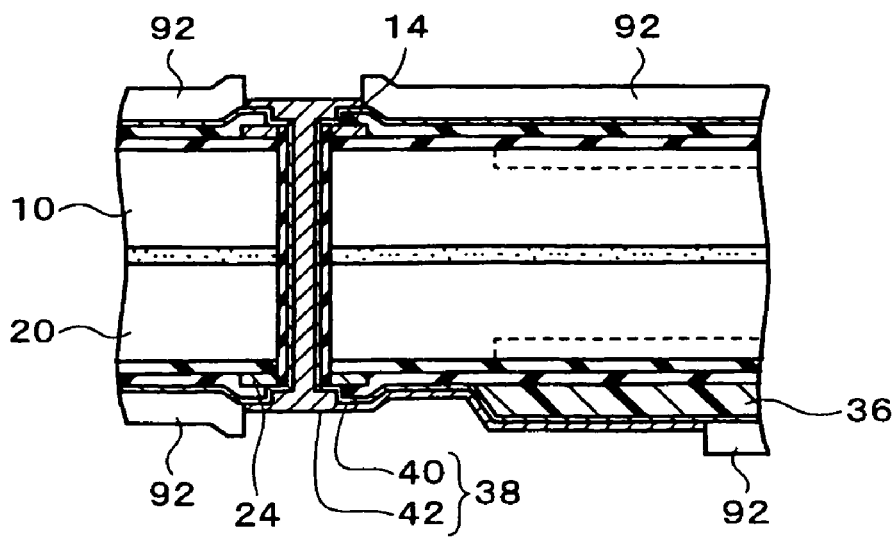

As shown in FIG. 6(C), a photoresist layer 92 for patterning the second conductive layer 42 may be formed. The photoresist layer 92 is in an inverted shape to a forming area of the conductive part 38 (refer to FIG. 2). And a conductive material is supplied to an opening part of the photoresist layer 92 to form the second conductive layer 42. The second conductive layer 42 may bury the through hole 32.

Figure 7A:
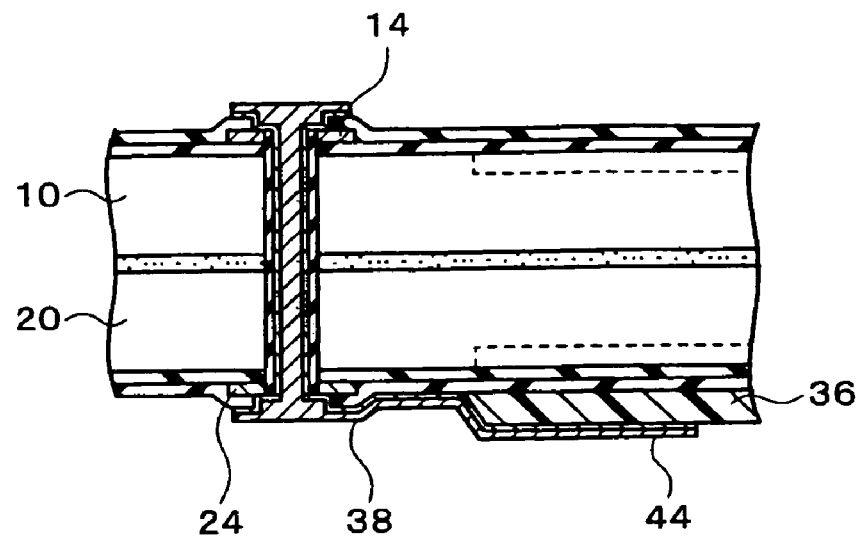
FIG. 7(A) to FIG. 7(B) are exemplary diagrams showing a manufacturing method of a semiconductor apparatus according to a first embodiment of this invention.

Thereafter, as shown in FIG. 7(A), the photoresist layer 92 is removed and an unnecessary portion of the first conductive layer 40 is removed. In this way, it is possible to provide the electrical continuity of both surfaces of the optical device through the conductive part 38. The method of forming the conductive part 38 is not limited to the above-mentioned method. The conductive part 38 may be formed so as to have an electrical connection 44. The electrical connection 44 may be subjected to pitch conversion. The details are as mentioned above.

Figure 7B:
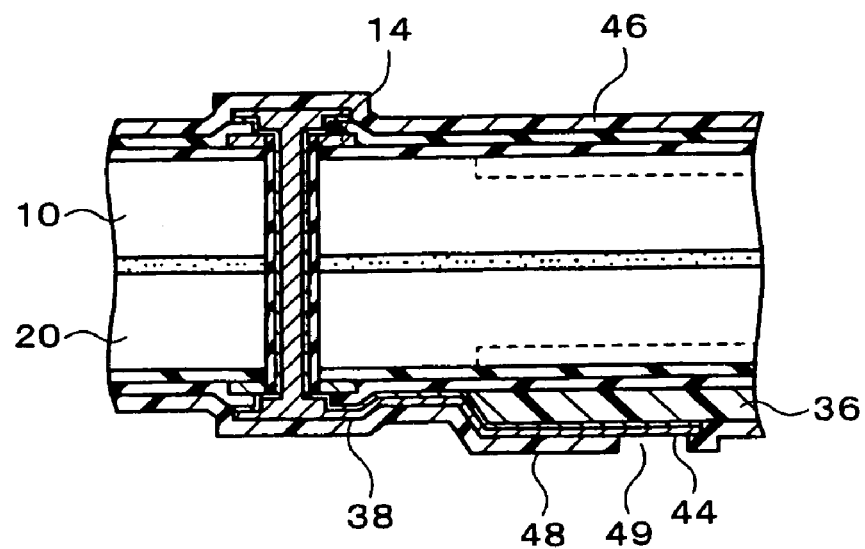

As shown in FIG. 7(B), the photoresist layers 46 and 48 may be formed on the first and the second semiconductor substrate 10 and 20. The photoresist layer 48 has an opening 39 on the electrical connection 44. The photoresist layer 48 may be a solder photoresist. Thereafter, the external terminal 50 is formed at the electrical connection 44, forming a covering layer 52 to reinforce the base of the external terminal 50 (refer to FIG. 3).

Figure 8:
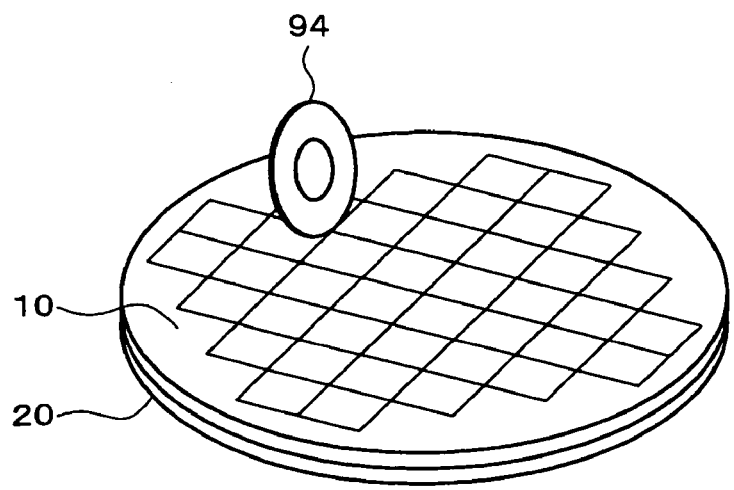
FIG. 8 is an exemplary diagram showing a manufacturing method of a semiconductor apparatus according to a first embodiment of this invention.

As shown in FIG. 8, if the first and the second semiconductor substrate 10 and 20 are semiconductor wafers, the through-hole 32 is formed corresponding to each of the first and the second semiconductor substrate 10 and 20, and the conductive part 38 is formed. Thereafter, the first and the second semiconductor substrate 10 and 20 may be cut (for example, dicing). For cutting, a cutter (for example, a dicer) 94 or a laser (for example, a $CO_2$ laser, a YAG laser and the like) may be used.

According to a manufacturing method of a semiconductor apparatus of this embodiment, after stacking the first and the second semiconductor substrate 10 and 20, the through-hole 32 continuously extending through these semiconductor substrates is formed and the conductive part 38 is so formed as to include the inside of the through-hole 32. Since the semiconductor apparatus having an integrated circuit on both surfaces is manufactured by stacking the first and the second semiconductor substrate 10 and 20, it is possible to keep cost under control and to improve reliability more than the method of forming an integrate circuit on both surfaces of a semiconductor substrate. Further, inasmuch as it is possible to form the through-hole 32 and the conductive part 38 in one package with the first and the second semiconductor substrate 10 and 20, the manufacturing process may be simplified.

Figure 9:
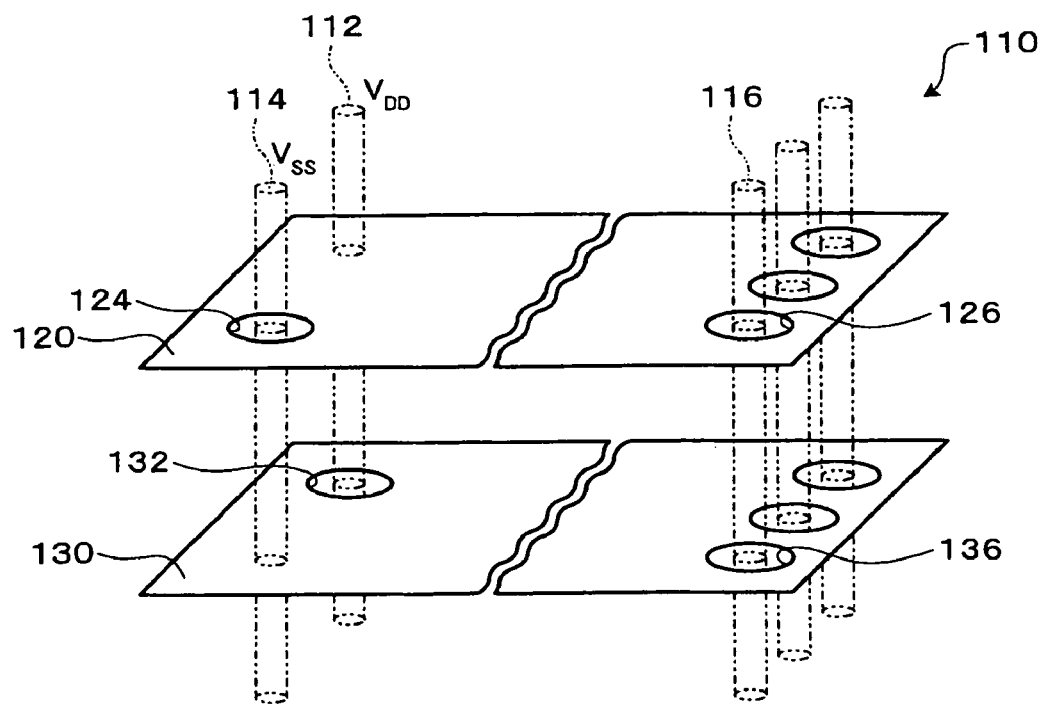
FIG. 9 is an exemplary diagram showing a manufacturing method of a semiconductor apparatus according to a second embodiment of this invention.

FIG. 9 is a diagram explaining a semiconductor apparatus according to the second embodiment of this invention. This embodiment may be applied to the above-mentioned optical device or optical module. FIG. 9 is a diagram explaining an intermediate layer interposed between the first and the second semiconductor substrate, and the first and the second semiconductor substrate are omitted.

In this embodiment, the intermediate layer 110 may have a metallic layer (in FIG. 9, first and second metallic layers 120 and 130). The metallic layer may be used as a light shielding layer. If the first semiconductor substrate 10 has the optical part 13 (refer to FIG. 1), the metallic layer may be formed in an area overlapping the optical part 13. Since the metallic layer reflects light (having the light shielding property), it may cut any unnecessary light incident to the optical device and keep the generation of noise in the optical device under control. The intermediate layer 110 has an insulating layer (omitted in FIG. 9) on the surfaces above and below the metallic layer. The insulating layer may be an adhesive material. The metallic layer is formed by keeping away from a through-hole (through-hole 32 in FIG. 3), which is formed continuously through the first and the second semiconductor substrate 10 and 20, and may be electrically shut off from a conductive part (the conductive part 38 in FIG. 3).

As shown in FIG. 9, the intermediate layer 110 may have a plurality of metallic layers (the first and the second metallic layer 120 and 130) and an insulating layer provided between respective metallic layers (omitted in FIG. 9). The first and the second metallic layer 120 and 130 are, at least, partly overlapping. And, at least one conductive part (for example, power supply terminal VDD) 112 is electrically connected to the first metallic layer 120 and, at least one other conductive part (for example, power supply terminal VSS) 114 is electrically connected to the second metallic layer 130. In particular, it is so designed that the conductive part 112 provides continuity to the first metallic layer 120 and no continuity to the second metallic layer 130 by passing through a hole 132. It is to be noted that other conductive parts (for example, input/output terminal) 116 are so designed not to provide continuity to the first and the second metallic layer 120 and 130 by passing through a hole 126 and a hole 136. According to this, an overlapping part of the first and the second metallic layer 120 and 130 becomes capacitance, hence, it is possible to improve the electric characteristics of a semiconductor apparatus (for example, an optical device). Further, since it is possible to place capacitance in the vicinity of the first and the second semiconductor substrate 10 and 20, a very remarkable high-frequency characteristic may be obtained. Furthermore, because it is possible to place the capacitance on the intermediate layer 110, a wasteful space is eliminated, thus contributing to further miniaturization of a semiconductor apparatus (an optical device or an optical module).

An insulating layer between the first and the second metallic layer 120 and 130 may be, for example, a silicon oxide film, a silicon nitride film, or a thin film of a ferro-dielectric substance. The insulating layer may be provided on the upper surface of the first metallic layer 120 and on the lower surface of the second metallic layer 130. The first and the second metallic layer 120 and 130 may be formed on the insulating layer by means of the sputtering method. The first and the second metallic layer 120 and 130 may be formed, for example, of a aluminum type or a copper type of metal. It is to be noted that after holes 124, 126, 134, and 136 are formed at specified sections, the first and the second metallic layer 120 and 130 may be interposed between the first and the second semiconductor substrate 10 and 20.

Separately from an example shown in FIG. 9, the metallic layer may be formed in more than three layers. In this case, at least one conductive part may be electrically connected to respective metallic layers. By doing so, capacitance redoubles. Hence, it is possible to accomplish further improvement of electric characteristics.

Figure 10:
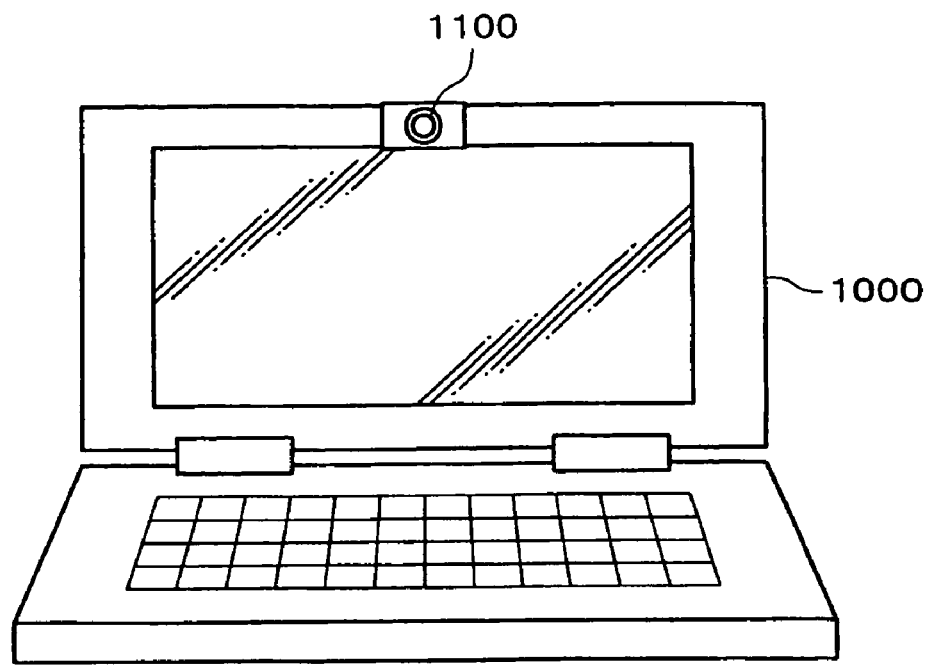
FIG. 10 is an exemplary diagram showing an electronic apparatus according to an embodiment of this invention.
Figure 11:
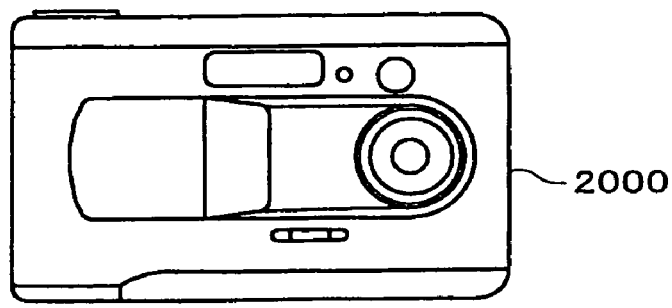
FIG. 11 is an exemplary diagram showing an electronic apparatus according to an embodiment of this invention.
Figure 12A:
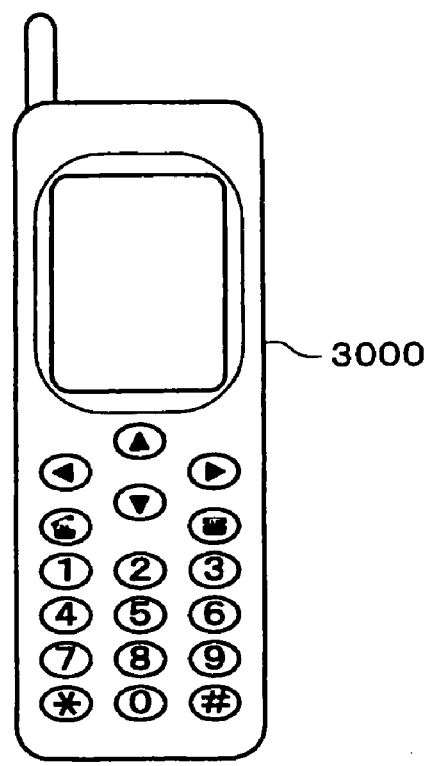
FIG. 12(A) and FIG. 12(B) are exemplary diagrams showing an electronic apparatus according to an embodiment of this invention.
Figure 12B:
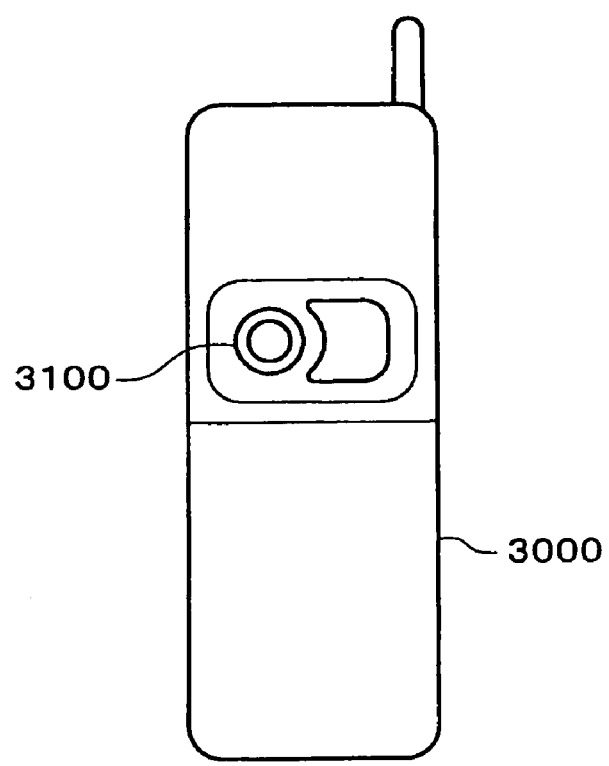

As an electronic apparatus according to an embodiment of this invention, a laptop personal computer 1000 shown in FIG. 10 has a camera 1100 in which the optical device, optical module or semiconductor apparatus is incorporated. Also, a digital camera 2000 shown in FIG. 11 includes the digital camera and the like. Furthermore, a mobile phone 3000 shown in FIG. 12(A) and FIG. 12(B) has a camera 3100 in which the optical device and the like are incorporated.

It should be understood that this invention is not limited by the above embodiments, and that various changes and modifications are possible. For example, this invention includes virtually the same structure as the structure described in the embodiments (for example, the function, method, and result are of the same structure or the object and result are of the same structure). Further, this invention includes a structure which replaced a non-essential part of the structure described in the embodiments. Still further, this invention includes a structure which provides the same operation-effect as the structure described in the embodiments or a structure which may accomplish the same object. Moreover, this invention includes a structure which consists of the structure described in the embodiments with the addition of known techniques.

What is claimed is:

1. An optical device, comprising:
  a first semiconductor substrate having an optical part and a first pad the optical part being fixedly formed on a surface of the first semiconductor substrate;
  a second semiconductor substrate stacked under the first semiconductor, the second semiconductor substrate having an integrated circuit and a second pad, the second semiconductor substrate being directly adhered via an adhesive layer to the first semiconductor substrate with no gap other than the adhesive layer between the first and second semiconductor substrates;
  a through-hole continuously extending through the first and the second semiconductor substrate; and
  a conductive part disposed on an inside of the through-hole.

2. The optical device according to claim 1,
  the optical part being formed on a side of a surface of the first semiconductor substrate opposite to the second semiconductor substrate.

3. The optical device according to claim 1,
  the integrated circuit being formed on a side of a surface of the second semiconductor substrate opposite to the first semiconductor substrate.

4. The optical device according to any one of claim 1,
  the through-hole being formed so as to extend through at least one of the first and the second pad.

5. The optical device according to any one of claim 1, further comprising:
  an insulating layer formed on the inside of the through-hole, the conductive part being disposed on the insulating layer.

6. The optical device according to claim 1, the conductive part having an electrical connection on a side of a surface of the second semiconductor substrate opposite to the first semiconductor substrate.

7. The optical device according to claim 6, a pitch of the electrical connection being larger than a pitch of the second pad.

8. The optical device according to claim 6, further comprising:
  an external terminal provided on the electrical connection.

9. The optical device according to claim 6, further comprising:
  a resin layer formed on the side of the surface of the second semiconductor substrate opposite to the first semiconductor substrate, the electrical connection being formed on the resin layer.

10. The optical device according to claim 9, the resin layer being formed in an area overlapping the optical part.

11. The optical device according to claim 1, further comprising:
  an intermediate layer interposed between the first and the second semiconductor substrate.

12. The optical device according to claim 11, the intermediate layer including a metallic layer formed in an area overlapping the optical part.

13. The optical device according to claim 1, the optical part having a plurality of light-receiving elements.

14. The optical device according to claim 13,
  each of the plurality of light-receiving elements being arrayed for image sensing.

15. An optical module, further comprising:
  an optical device according to claim 1;
  a wiring substrate facing the second semiconductor substrate; and
  a substrate member holding a lens mounted on the wiring substrate and being provided above the first semiconductor substrate.

16. An electronic apparatus, comprising:
  the optical device according to claim 1.

17. An optical device, comprising:
a first semiconductor substrate having an optical part and a first pad the optical part being fixedly formed on a surface of the first semiconductor substrate;
a second semiconductor substrate having an integrated circuit and a second pad being stacked under the first semiconductor;
a through-hole continuously extending through the first and the second semiconductor substrate and continuously extending from the first semiconductor substrate to the second semiconductor substrate; and
a conductive part disposed on an inside of the through-hole.

* * * * *